(12) United States Patent
Egner et al.

(10) Patent No.: US 8,402,325 B2
(45) Date of Patent: Mar. 19, 2013

(54) DATA STORAGE AND REPLAY APPARATUS

(75) Inventors: Sebastian Egner, Berlin (DE); Nicolaas Lambert, Waalre (NL); Ludovicus M. G. M. Tolhuizen, Waalre (NL); Victor M. G. Van Acht, Waalre (NL); Martinus W. Blum, Eindhoven (NL)

(73) Assignee: ST-Ericsson SA, Plan-les-Ouates (CH)

( * ) Notice: Subject to any disclaimer, the term of this patent is extended or adjusted under 35 U.S.C. 154(b) by 369 days.

(21) Appl. No.: 11/573,192

(22) PCT Filed: Jul. 22, 2005

(86) PCT No.: PCT/IB2005/052475
§ 371 (c)(1),
(2), (4) Date: Oct. 30, 2008

(87) PCT Pub. No.: WO2006/013529
PCT Pub. Date: Feb. 9, 2006

(65) Prior Publication Data
US 2009/0150748 A1 Jun. 11, 2009

(30) Foreign Application Priority Data
Aug. 2, 2004 (EP) .................................... 04103711

(51) Int. Cl.
*G06F 11/08* (2006.01)
*G06F 11/32* (2006.01)
(52) U.S. Cl. ........................................ 714/704; 714/758
(58) Field of Classification Search .................. None
See application file for complete search history.

(56) References Cited

U.S. PATENT DOCUMENTS

| 3,934,462 | A | * | 1/1976 | Rende ............................ 600/405 |
| 4,701,923 | A | | 10/1987 | Fukasawa et al. |
| 5,371,745 | A | * | 12/1994 | Kiyonaga et al. ............. 714/758 |
| 5,923,814 | A | * | 7/1999 | Boyce ............................ 386/328 |
| 5,982,766 | A | | 11/1999 | Nystrom et al. |
| 6,088,817 | A | * | 7/2000 | Haulin ............................ 714/42 |

(Continued)

FOREIGN PATENT DOCUMENTS

| JP | 6187248 A | 7/1994 |
| JP | 10312340 A | 11/1998 |

(Continued)

*Primary Examiner* — Ajay Bhatia
*Assistant Examiner* — Dipakkumar Gandhi
(74) *Attorney, Agent, or Firm* — Coats & Bennett, P.L.L.C.

(57) ABSTRACT

A data storage and replay device uses measurements of the evolution of performance of the storage medium (typically a flash memory circuit) to predict an error rate of retrieval from a region of the storage medium. The prediction is used as a basis for dynamically selecting an ECC for encoding the data prior to storage of the data. The ECC is selected from a plurality of available ECC's so that a fastest encodable ECC is selected that is predicted to produce no more than a predetermined post-decoding error rate given the information. On decoding the data, which is typically audio or video data, is decoded and replayed at a predetermined speed. In another embodiment, the data stored using a plurality of ECC's together and an ECC is selected dynamically for decoding, so that an output data rate can be maximized or power consumption on replay can be minimized.

13 Claims, 1 Drawing Sheet

U.S. PATENT DOCUMENTS

| | | | |
|---|---|---|---|
| 6,405,277 B1 * | 6/2002 | Jen et al. | 711/4 |
| 2002/0178421 A1 | 11/2002 | Hassner et al. | |
| 2003/0014717 A1 * | 1/2003 | Yedidia et al. | 714/804 |
| 2003/0037299 A1 | 2/2003 | Smith | |
| 2003/0041298 A1 | 2/2003 | Bruner et al. | |
| 2004/0083333 A1 | 4/2004 | Chang et al. | |
| 2005/0172179 A1 | 8/2005 | Brrandenberger et al. | |

FOREIGN PATENT DOCUMENTS

| | | |
|---|---|---|
| JP | 2004-152194 | 5/2004 |
| JP | 2004-164634 | 6/2004 |

\* cited by examiner

DATA STORAGE AND REPLAY APPARATUS

The invention relates to a device and method for storing and replaying data to and form a storage medium such as, in particular, a flash memory. Preferably the invention relates to storage and replay of real-time replayable data, such as audio or video streams.

U.S. patent application No. 2003/0217323 addresses the problems associated with deterioration of flash memory. As is well known flash memory and other storage media may suffer from bit errors. A conventional way of dealing with these bit errors is to store data using an error correcting code (ECC) and to use the ECC to correct errors on reading the data. However, the bit error rate of flash memory increases with time as the memory wears out. As a result error correction may eventually become impossible. U.S. patent application No. 2003/0217323 describes how detection of weak cells can initially be used to supply the error correction circuitry with information about bits that should be treated as unreliable. Ultimately detection of too many weak bits is used to trigger rewriting or even moving of a data block to a better memory area. US 2003/0033567 and US2003/0043647 similarly disclose moving of data in flash memory to better memory areas upon detection of too many errors. Thus weak memory areas are effectively abandoned.

The average elapsed service life before a memory area has to be abandoned depends on the quality of the ECC. A simple ECC like a Hamming code requires a memory area to be abandoned sooner than a more complex ECC like a Reed Solomon code. To retain as much useful memory for as long as possible it is therefore desirable to use the strongest possible ECC. A strong ECC, however, requires a considerable computational overhead both for encoding and decoding. For typical real-time replayable data, such as audio or video data (e.g. MP3 data), where no more than a predetermined reading speed is needed, reading speed limitations due to ECC decoding speed usually do not affect replay speed. In this case one can therefore use a strong ECC to maximize available memory space. The same goes for encoding during real time recording. However, even for this type of data use of the selection of the ECC involves a trade-off because encoding during downloading of prerecorded data, or decoding during transmission for a download limits downloading speed. Also, uses of a computationally intensive ECC increases power consumption.

Using such a trade-off to select a specific ECC for the entire useful life of the storage medium unnecessarily sacrifices speed and/or power consumption during the early life of the medium. The error rate of the storage medium like flash memory deteriorates during its useful life. Therefore, an ECC that makes a given amount of memory available at one stage during the useful life is unnecessarily complex to make the same amount of memory available earlier in the life of the medium.

Among others it is an object of the invention to make efficient use of a storage medium, particularly of a flash memory, whose error rate changes during its useful life, while permitting a high access speed to the medium.

Among others it is an object of the invention to maximize downloading speed for such a storage medium subject to efficient memory use, particularly for storing real-time replayable media data.

It is another object of the invention to reduce power consumption in a storage and replay apparatus, particularly in a battery operated apparatus.

A data storage and replay device according to the invention is set forth in claim 1. According to the invention the device uses measurements of the evolution of the performance of the storage medium (typically a flash memory circuit) to predict an error rate of retrieval from a region of the storage medium. The prediction is used as a basis for selecting an ECC from a plurality of available ECC's for encoding the data prior to storage of the data. It may be noted that "encoding into an ECC" typically involves systematic encoding wherein the data is copied and parity symbols are added, in which case encoding before writing means determining the parity symbols from received data, not from data that has been retrieved from the memory region involved. This does not exclude later encoding of retrieved (and if necessarily corrected) data using other ECC's. However, it will be understood that encoding also encompasses non-systematic encoding, wherein data units are translated into codeword without always copying the data into the codeword. Preferably the ECC is selected from a plurality of available ECC's so that a fastest encodable ECC is selected that is predicted to produce no more than a predetermined post-decoding error rate given said information. In this way the speed of transmission of data to the device can be maximized while keeping the error rate below an acceptable level in the predicted future after decoding. In addition, use of such an ECC that requires a minimum of computation also reduces power consumption needed for the computation. This reduces overall power consumption, which may be an important factor in battery operated equipment.

Preferably a decoder circuit is provided that is arranged to read the data from said region as well as information that is indicative of the selected ECC for the region and to decode the data from the region according to the indicated ECC. Thus no further encoding is needed. However, in another embodiment the data may later be encoded according to a plurality of ECC's. If this happens once the data has been stored in the storage medium the further encoding does not compromise the speed of reception. In this case, de decoder may select to decode according to any ECC, for example the least error prone ECC. If the decoded data is used for real time signal rendering (e.g. audio and/or video signal rendering) in this case, any ECC may be selected that does not compromise rendering speed.

The decoder circuit may also select an ECC from a plurality of ECC's in which the data has been encoded, so as to decode the data according to the selected ECC. The ECC may be selected dependent on the information about the predicted error rate. In this case a variable speed of transmission of data from the device can be maximized while keeping the error rate below an acceptable level. This may be applied also if the data has not originally been written with an adaptively selected ECC, for example if the data has been written during real-time recording when the computational overhead for encoding is not critical so that a strong ECC may be used. Encoding information (e.g. parity symbols) according to different ECC's may then be added during recording or later.

Preferably respective information about the predicted error rate is determined for respective regions of the storage medium and the ECC is selected adaptively for each region independently. In this way differences between the quality of different regions, which may be due for example to more and less intensive prior use can be exploited to achieve higher access speed.

These and other objects and advantageous aspects will be described for examples of embodiments of the invention, using the following figure.

Figure 1:
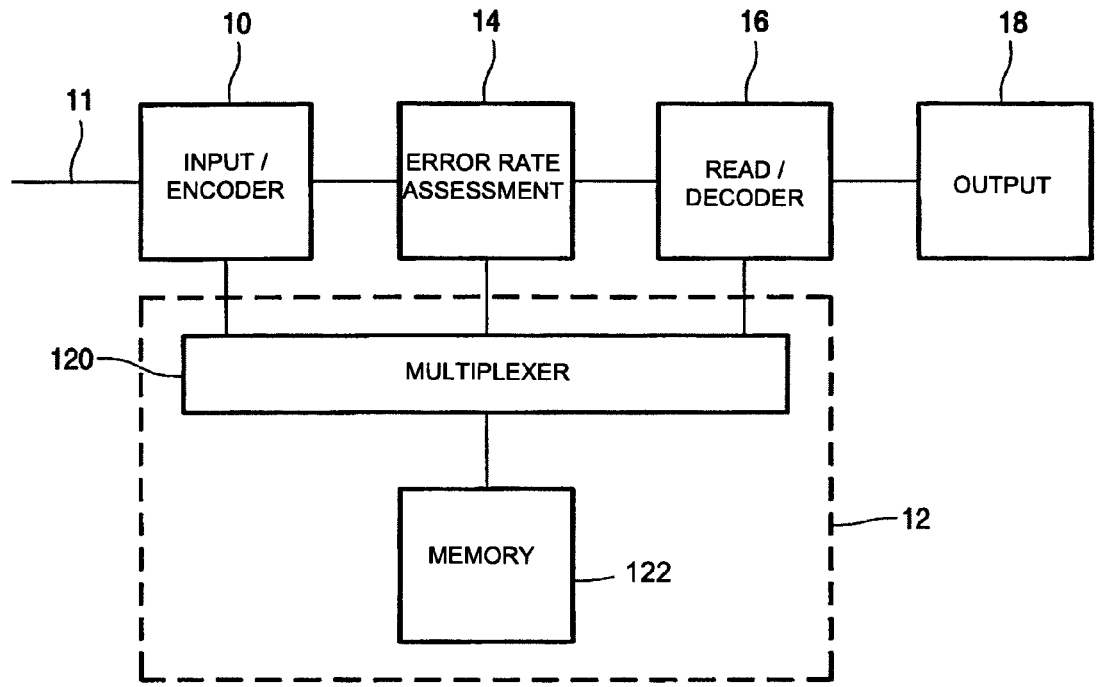
FIG. 1 shows a store and replay apparatus

FIG. 1 shows a store and replay apparatus comprising an input/encoder circuit 10, a flash memory circuit 12, an error rate assessment circuit 14, a read/decoder circuit 16 and an output circuit 18. Input/encoder circuit 10 has an input 11 which may be coupled to the Internet, for example, for receiving download data. Optionally input/encoder circuit 10 may have a further input (not shown) for receiving real time audio and/or video data, for a microphone or camera for example. Input/encoder circuit 10 has an output coupled to flash memory circuit 12 and an interface coupled to assessment circuit 14. Read/decoder circuit 16 has an interface coupled to flash memory circuit 12 and assessment circuit 14 and an output coupled to output circuit 18. Output circuit 18 contains for example a display screen (not shown separately) and/or a loudspeaker (not shown separately) for rendering a video and/or audio signal that is encoded by data stored in flash memory circuit 12. Optionally, read/decoder circuit 16 may have a further output (not shown) for transmitting retrieved data to other devices (not shown) at a higher rate than to output circuit 18. Flash memory circuit 12 contains a memory proper 122 and a multiplexer 120 to give all of input/encoder circuit 10, assessment circuit 14 and read/decoder circuit 16 access to the same memory 122.

In operation read/decoder circuit 16 is used to read data from flash memory circuit 12 and to convert the data into signals that determine e.g. audio and/or video signals that are rendered by output circuit 18. Read/decoder circuit 16 performs correction of errors in the data from flash memory circuit 12 by decoding according to an ECC (Error Correcting Code). Typically, data encoded in an ECC comprises a copy of the actual data plus additional parity symbols. In this case, error correcting decoding involves determining whether the combination of the data and parity symbols is a code word of the ECC and, if not, determining a closest codeword from the ECC, in which case the data from that closest codeword is used. In this decoding process the closest codeword is determined for example by computing a number of syndromes from the retrieved combination of the data and parity symbols and generating corrections as a function of the computed syndromes. However, without deviating from the invention other types of decoding may be used, for example for decoding of non-systematic codes wherein the codeword does not contain a copy of the data.

Input/encoder circuit 10 writes the data into flash memory circuit 12 for later reading. Typically, the data is downloaded from another storage device, e.g. via the Internet, at a much higher data rate than needed for replay at output circuit 18. Input/encoder circuit 10 encodes the data into the ECC, typically by computing and adding parity symbols for the received data. Input/encoder circuit 10 writes the encoded data (e.g. the original data plus parity symbols) into flash memory circuit 12 for later reading. However, without deviating from the invention other types of encoding may be used, using non-systematic codes for example which are not limited to adding redundant parity symbols, but include mapping data to codewords which do not necessarily contain a copy of the data.

The ECC used for writing and reading from flash memory circuit 12 is selected dynamically as a function of memory quality. The number of bit errors on reading block of data typically increases as a function of time as the memory wears out. The predicted number of bit errors is used to select which of a number of different available ECC's will be used. The more errors are predicted, the "heavier" the ECC that is selected, i.e. higher the ratio between correction capacity and required computation time of the ECC.

Assessment circuit 14 may use any convenient way to provide a prediction of the number of errors. In one embodiment for example assessment circuit 14 periodically reads data from flash memory circuit 12 (or monitors data read by read/decoder circuit 16) and uses the results of ECC decoding to detect errors, the frequency of detected errors being used as a prediction of the future error rate. In another embodiment, assessment unit 14 may measure the analog level of output signals from memory cells with higher accuracy than necessary for bit reading so as to determined the likelihood of erroneous bit reading. Combinations of these techniques and other techniques may be used as well. Typically, assessment unit 14 makes respective predictions for respective different regions of the memory (herein regions are e.g. rows of the memory matrix, or blocks of cells that can only be erased together), since the error rate may depend on the previous use of each region concerned. Assessment circuit 14 performs repeated quality assessments, typically periodically, but for each particular region preferably at least before the particular region is made available for writing downloaded data.

Input/encoder circuit 10 is typically arranged to perform encoding according to a selectable one of a number of different ECC's. Known ECC's may be used such as for example versions of a Hamming code or a Solomon code, possibly using multiple versions of these types of code with mutually different word sizes or number of parity bits, or product codes using any ECC for rows and columns. A choice may also be made between different versions of Reed Solomon codes with mutually different parameters, and/or between different versions of Hamming codes whereby the amount of computations and the robustness against errors can also be varied. Reed Solomon codes typically can correct more errors than Hamming codes, but also require more computations to encode the data (to determine parity symbols) and/or to decode the data (to determine syndromes and the associated corrections). Input/encoder circuit 10 ranks the available ECCs according to increasing computational requirements (the ECC's in the ranking being selected so that each ECC with higher computational requirement in the ranking also has higher error correction capacity). Before reading input/encoder circuit 10 retrieves information about the predicted error rate from assessment circuit 14 and selects the ECC that will be used for encoding as a function of this information. Effectively, the range of possible predicted error rates is divided into successive sub-ranges, which are each associated with a respective ECC from the ranking, so that higher ranked (more computationally intensive) ECC are associated with higher predicted error rate. Input/encoder circuit 10 encodes the incoming data according to the ECC associated with the predicted error rate. Thus, a more computationally intensive ECC will be used when the predicted error rate is higher. Input/encoder circuit 10 stores information that identifies the ECC that has been used for later use during decoding. Typically, this information is stored in memory circuit 12 in association with the memory region where the data is stored (protected against errors, for example by use of some predetermined heavy ECC), or in a separate memory (not shown).

Typically information about different predicted error rates for different regions of memory circuit 12 is available. In this case input/encoder circuit 10 preferably adapt the ECC on a region by region basis, selecting the least heavy ECC allowed for each region (herein regions are for example respective lines of the memory matrix or blocks of memory cells that are erased together).

In the case of a high-speed download of the data, the ECC that is selected affects the download speed. On average successive data blocks can only be sent at a rate that allows for the computation of the ECC encoded data. Preferably, input/decoder circuit 10 has some mechanism to slow down the source of the data dependent on its readiness to perform encoding of a next block of data. A request/acknowledge handshake mechanism or a request for retry mechanism may be used for example. To a certain extent this need to slow down download speed can be mitigated by buffering the incoming data in a low error buffer memory (not shown) before writing the ECC encoded data into the more error prone memory circuit 122. A separate buffer such as an SRAM or DRAM memory, or a part of memory 122 that has low predicted error rate may be used. But when long download files typical for audio or video data are involved this approach is limited by the feasible buffer size. The average speed of incoming data has to match the ECC encoding speed.

It should be appreciated that the encoding according to the selected ECC (e.g. the computation of the parity symbols) cannot be performed on data that is stored in its eventual region of memory circuit 122 and later retrieved. After retrieval the data is prone to errors. Therefore encoding must take place essentially when the data is received. It should also be appreciated that, of course, the disclosed embodiment is merely an example and that many alternatives exist. For example, without deviating from the invention the stored ECC encoded data may later be retrieved and encoded using a "heavier" ECC. As long as the original ECC is sufficiently strong to correct the expected number of errors this can be done without much risk of error. In this way, the stronger ECC may be used for reading, which protects against later wear of the memory. If all used ECC's provide for copies of the data plus parity symbols a number of ECC's may thus be used in parallel. As another example, assessment circuit 14 may be designed to test a region of memory circuit 122 and to predict its error rate in response to a request from input/encoder circuit 10 that is issued prior to writing into the region. In this case no information about the assessment need be stored for later use at an undetermined time. The information about the error rate may take the form of a number that is proportional to the error rate, but instead assessment unit may effectively select the ECC by using information that classifies the error rate according to required ECC.

Furthermore, although the example of selection of ECC's for high speed downloading has been used, it should be appreciated that it may also make sense to select the ECC at lower speed recording (e.g. of "live" audio and/or video data). Although the computation time for encoding may not be relevant in this case, it may be useful to use as light an ECC as consistent with the predicted error rate, so that high speed reading from memory circuit 122 for upload purposes is facilitated. This may also be advantageous even if the data rate is fixed, because use of the least computationally intensive ECC minimizes power consumption, extending battery life of portable audio and/or video equipment. In an alternative embodiment, that data is stored using a plurality of ECC's for the same data, so that read/decoder circuit 16 will be able to select the most convenient ECC for decoding. Preferably input/encoder circuit 10 divides data in blocks of a predetermined size and writes each data block into a memory unit of a predetermined size, where the block leaves sufficient room for the maximum amount of additional data (e.g. parity symbols) due to any ECC, so that the memory unit size is independent of the ECC that is actually used. In this way addressing on retrieval can be performed independent of the selected ECC and optionally the ECC can later be changed without moving the data blocks.

On replay, read/decoder circuit 16 reads the information that identifies the ECC that has been used for encoding, reads the data from memory circuit 12 and decodes the data according to the identified ECC. Typically, the replay speed is so slow that the computational overhead for decoding poses no problem for the replay speed. In a further embodiment, wherein the stored data is later re-encoded with a heavier ECC, read/decoder circuit 16 uses the heavier ECC. In this case the dynamically selected ECC is only used when the data is read before re-encoding has taken place.

In certain applications, a read/decoder circuit 16 may also be used to transmit data at high speed, for example during a further download wherein memory circuit 122 functions as source of the data. In this case the ECC that is used for decoding may limit the download speed. When the data has been written encoded by input/encoder circuit with one selected ECC (preferably one ECC per memory region), read/decoder circuit 16 accesses information that identifies this ECC and the identified ECC is used. In this case this ECC may affect download speed. Alternatively, when the data has been stored in memory circuit 122 encoded in a plurality of ECC's, read/decoder circuit 16 may query assessment circuit 14 to obtain information about a latest predicted error rate and to select the least computationally ECC that is able to correct errors at this rate. This may be done on a region by region basis, so that different ECC's may be used for different memory regions. The selected ECC's are used to decode the data. In this way a maximum download speed can be realized.

It should be appreciated that ECC decoding does not guarantee error free decoding. Accordingly, the selected ECCs are not selected according to a requirement that no errors should occur. Rather, the criterion is preferably that the fastest implementable ECC should be used that produces no more than a predetermined post-decoding error rate given the predicted error rate of the region of memory circuit 12 where the data is stored. Under exceptional circumstances the decoder or encoder may even switch to a faster ECC if overruling speed considerations prevent the use of a heavy ECC.

Figure 2:
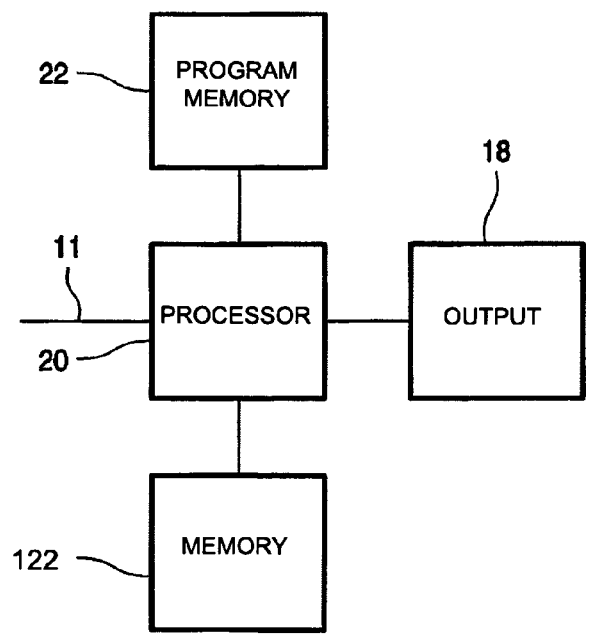
FIG. 2 shows a further store and replay apparatus

Although a separate input/encoder circuit 10, assessment circuit 14 and read/decoder circuit 16 have been shown, it should be understood that these functions may in practice be implemented using one circuit or distributed over different circuits in a different way. Suitably programmed programmable processors may be used for encoding and decoding, or a single suitably programmed processor for both encoding and decoding may be used for example. Similarly assessment circuit 14 may be a suitably programmed processor, possibly the same as used for encoding and/or decoding. The program or programs may be fixedly programmed or loaded using a computer program product such as a disk or an Internet signal. FIG. 2 shows an example of a circuit wherein a programmable processor 20 is provided to execute a program from a program memory 22 to perform the functions of assessment, selection of the ECC, encoding and decoding.

The invention claimed is:

1. A data storage and replay device comprising:
 a storage medium including a plurality of regions;
 an error rate assessment unit configured to generate information about a prediction of an error rate of retrieval for respective ones of the plurality of regions based on measurements of performance of the respective ones of the plurality of regions of the storage medium during use, the measurements of performance being made repeatedly during a useful life of the storage medium based on data for real time signal rendering; and
 an encoder configured to:
  perform encoding of received data into each of a plurality of error correcting codes (ECCs);
  divide the encoded data into blocks having a similar predetermined first size; and
  store the encoded received data into the plurality of regions, each of the plurality of regions having a similar predetermined second size that is sufficiently larger than the first size to also store additional data associated with the encoded received data.

2. The data storage and replay device according to claim 1, further comprising an input circuit that is configured to adapt a rate of reception of the received data dependent on a selected ECC.

3. The data storage and replay device according to claim 1, further comprising a decoder circuit configured to read the data from the plurality of regions as well as information that is indicative of the plurality of ECCs for each respective region, decode the data from the respective regions according to each ECC, and select the each respective region according to the error rate of the respective region at each ECC.

4. The data storage and replay device according to claim 3, wherein the ECC is selected from a plurality of available ECC's so that a fastest encodable ECC is selected that is predicted to produce no more than a predetermined post-decoding error rate associated with the information.

5. The data storage and replay device according to claim 3, further comprising an output configured to output decoded data at least at a predetermined replay rate for use in audio and/or video replay.

6. The data storage and replay device according to claim 1, wherein the storage medium comprises a flash memory circuit.

7. A data storage and transmission device comprising:
a storage medium comprising a plurality of regions;
an error rate assessment unit configured to generate information about a prediction of an error rate of retrieval for respective ones of the regions based on measurements of performance of the respective ones of the plurality of regions of the storage medium during use, the measurements of performance being made repeatedly during a useful life of the storage medium based on data for real time signal rendering; and
a decoder configured to perform decoding of data, which is retrieved from the plurality of regions of the storage medium according to a plurality of error correcting codes (ECCs), the decoder selecting one ECC for each particular region from the plurality of available ECC's dependent on the information for the particular region from the error rate assessment unit obtained during the useful life of the storage medium,
wherein the data is divided into blocks having a similar predetermined first size, each of the plurality of regions having a similar predetermined second size that is sufficiently larger than the first size to also store additional data associated with encoded received data.

8. The data storage and transmission device according to claim 7, further comprising an output circuit that is configured to adapt a rate of transmission of the retrieved and decoded data dependent on the selected ECC.

9. The data storage and transmission device according to claim 7, further comprising an encoder circuit configured to store the data initially encoded for the plurality of regions according to each of the plurality of ECCs.

10. The data storage and transmission device according to claim 7, wherein the storage medium comprises a flash memory circuit.

11. A method of writing data into a storage medium, the method comprising:
gathering, repeatedly during a useful life of the storage medium, measurements of performance for a plurality of regions of the storage medium based on data for real time signal rendering;
generating information about a prediction of an error rate of retrieval for respective ones of the regions based on the measurements;
encoding received data according to each of a plurality of error correcting codes (ECCs);
dividing the encoded data into blocks having a similar predetermined first size; and
storing the encoded received data into the respective one of the regions, each of the plurality of regions having a similar predetermined second size that is sufficiently larger than the first size to also store additional data associated with the encoded received data.

12. A method of reading data from a storage medium, the method comprising:
gathering, repeatedly during a useful life of the storage medium, measurements of performance for a plurality of regions of the storage medium based on data for real time signal rendering;
generating information about a prediction of an error rate of retrieval for respective ones of the regions based on the measurements;
selecting for each particular region a plurality of error correcting codes ECCs that are supported by a decoder;
decoding data retrieved from a region of the storage medium with the decoder according to the selected ECC; and
selecting one ECC for the region from the plurality of ECCs dependent on the information for the particular region from an error rate assessment unit obtained during the useful life of the storage medium,
wherein the data is divided into blocks having a similar predetermined first size, each of the plurality of regions having a similar predetermined second size that is sufficiently larger than the first size to also store additional data associated with encoded received data.

13. A non-transitory computer program product comprising machine instructions which, when loaded into a programmable computer, cause the computer to:
gather, repeatedly during a useful life of a storage medium, measurements of performance for a plurality of regions of the storage medium based on data for real time signal rendering;
generate information about a prediction of an error rate of retrieval for respective ones of the regions-based on the measurements;
encode received data according to each of a plurality of error correcting codes (ECCs) with an encoder before storage of the encoded received data into the respective one of the regions;
divide the encoded data into blocks having a similar predetermined first size; and
store the encoded received data into the respective one of the regions, each of the plurality of regions having a similar predetermined second size that is sufficiently larger than the first size to also store additional data associated with the encoded received data.

* * * * *